United States Patent
Kobayashi et al.

(10) Patent No.: US 7,369,443 B2
(45) Date of Patent: May 6, 2008

(54) SEMICONDUCTOR DEVICE WITH ADJUSTABLE SIGNAL DRIVE POWER

(75) Inventors: Hiroyuki Kobayashi, Kawasaki (JP); Toshiya Uchida, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 163 days.

(21) Appl. No.: 11/151,311

(22) Filed: Jun. 14, 2005

(65) Prior Publication Data

US 2006/0181312 A1     Aug. 17, 2006

(30) Foreign Application Priority Data

Feb. 17, 2005    (JP) .............. 2005-040974

(51) Int. Cl.
*G11C 7/10*    (2006.01)
*H03K 17/16*   (2006.01)
*H03K 19/003*  (2006.01)

(52) U.S. Cl. .............. 365/189.01; 365/225.7; 326/30

(58) Field of Classification Search ........... 326/63–68, 326/81–87; 327/108, 109, 68, 112, 126, 327/127, 333; 365/94, 96, 225.7, 95
See application file for complete search history.

(56) References Cited

U.S. PATENT DOCUMENTS

| | | | |
|---|---|---|---|
| 5,134,311 A * | 7/1992 | Biber et al. ............... 327/108 |
| 5,434,823 A * | 7/1995 | Howard ................. 365/230.06 |
| 5,751,649 A * | 5/1998 | Kornachuk et al. ......... 365/205 |
| 5,801,548 A * | 9/1998 | Lee et al. .................... 326/44 |
| 6,188,237 B1 * | 2/2001 | Suzuki et al. ................ 326/30 |
| 6,208,168 B1 * | 3/2001 | Rhee ............................ 326/83 |
| 6,229,758 B1 * | 5/2001 | Agata ........................ 365/233 |
| 6,307,791 B1 * | 10/2001 | Otsuka et al. ......... 365/189.05 |
| 6,362,656 B2 * | 3/2002 | Rhee ............................ 326/87 |
| 6,556,485 B2 | 4/2003 | Shimizu et al. |
| 6,563,343 B1 * | 5/2003 | Patel et al. ................... 326/87 |
| 6,642,740 B2 * | 11/2003 | Kim et al. ..................... 326/30 |
| 6,816,427 B2 * | 11/2004 | Novosel et al. .......... 365/225.7 |
| 6,919,738 B2 * | 7/2005 | Kushida ....................... 326/82 |
| 7,035,148 B2 * | 4/2006 | Chung et al. .......... 365/189.05 |
| 7,079,425 B2 * | 7/2006 | Chun .................... 365/189.01 |
| 7,079,445 B2 * | 7/2006 | Choi et al. .................. 365/233 |
| 7,133,318 B2 * | 11/2006 | Chung et al. .......... 365/189.05 |
| 2003/0122574 A1 * | 7/2003 | Kushida ....................... 326/30 |
| 2005/0007835 A1 * | 1/2005 | Lee et al. .............. 365/189.12 |
| 2007/0002675 A1 * | 1/2007 | Koo ........................... 365/233 |

FOREIGN PATENT DOCUMENTS

| | | |
|---|---|---|
| JP | 5-206829 A | 8/1993 |
| JP | 2002-111474 A | 4/2002 |
| JP | 2002-300023 A | 10/2002 |

* cited by examiner

*Primary Examiner*—Vibol Tan
*Assistant Examiner*—Dylan White
(74) *Attorney, Agent, or Firm*—Arent Fox LLP

(57) ABSTRACT

A semiconductor device includes a terminal configured to receive a first signal that is set from an exterior at a time of operation, a memory unit configured to retain a state of a setting fixedly regardless of whether at the time of operation or at a time of no operation and to produce at an output thereof a second signal responsive to the state of a setting, and an output driver unit coupled to the terminal and to the output of the memory unit to output an output signal by a drive power responsive to the first signal and the second signal.

9 Claims, 9 Drawing Sheets

|  | 25% | 50% | 75% | 100% |
|---|---|---|---|---|
| S1 | H | H | H | H |
| S2 | L | H | H | H |
| S3 | L | L | H | H |
| S4 | L | L | L | H |

SEMICONDUCTOR DEVICE WITH ADJUSTABLE SIGNAL DRIVE POWER

CROSS-REFERENCE TO RELATED APPLICATIONS

The present application is based upon and claims the benefit of priority from the prior Japanese Patent Application No. 2005-040974 filed on Feb. 17, 2005, with the Japanese Patent Office, the entire contents of which are incorporated herein by reference.

BACKGROUND OF THE INVENTION

1. Field of the Invention

The present invention generally relates to semiconductor devices, and particularly relates to a semiconductor device which is provided with an output circuit capable of adjusting a signal drive power.

2. Description of the Related Art

As signal frequency is raised for the purpose of increasing transmission speed between semiconductor device chips, signal overshoot, undershoot, ringing, reflection, etc., emerge as factors that prevent high-speed and reliable data transfer. In order to reduce the effects of these factors, it is necessary to perform impedance matching by matching the transmission load with the signal drive power for transmitting signals from the semiconductor device.

It is difficult, however, to construct a system by designing transmission lines such as to make them match the signal drive power of the semiconductor device. When a system is constructed by using semiconductor devices, the load of the transmission lines vary depending on the configuration of the system. In order to achieve high-speed and reliable data transmission, however, there is a need to decrease the signal drive power in light of the load of the transmission lines if the load is small, and there is a need to increase the signal drive power in light of the load of the transmission lines if the load is large. It is thus preferable to provide a semiconductor device with the function to adjust the signal drive power according to the transmission load.

Patent Documents 1 through 3 disclose configurations in which a semiconductor device is provided with the function to adjust the signal drive power. In Patent Document 1, an output buffer is provided with a selector serving as an output current control circuit, which is controlled by a control signal supplied from an exterior, so that the output current is adjusted to a value suitably adapted to the system. In Patent Document 2, a plurality of transistors having different sizes are connected in parallel to form an output buffer circuit, and the on/off state of each transistor is controlled to adjust the impedance of the output buffer circuit. In Patent Document 3, first and second current drive units contained in an output buffer are selectively set to an activated state or deactivated state at a process following the manufacturing process, thereby adjusting the current drive power of the output buffer.

[Patent Document 1] Japanese Patent Application Publication No. 5-206829

[Patent Document 2] Japanese Patent Application Publication No. 2002-111474

[Patent Document 3] Japanese Patent Application Publication No. 2002-300023

In semiconductor devices, it is unavoidable that there is variation in the operating characteristics depending on the process conditions of the manufacturing process. As a result, the signal drive power of semiconductor devices may differ by a factor of 2 among chips. In such a case, even if the function to adjust the signal drive power is provided in the semiconductor device, such function may not be sufficiently effective.

A system may be configured such that the signal drive power can be selected from 25%, 50%, 75%, and 100%, for example. A power of 50% may then be selected in light of the transmission load. If the signal drive power varies by a factor of 2 between the chips, setting the signal drive power to 50% in a given semiconductor chip may result in the actual signal drive power being as large as 100% or as small as 25%. Accordingly, even if the system controller makes a proper selection suitable for the transmission load, an expected signal drive power may not be attained. Because of this, a need arises to design a system by taking into account variation in the signal drive power, which functions as a factor to place an upper limit to the operating frequency.

Accordingly, there is a need for a semiconductor device which can achieve a desired signal drive power without being affected by manufacturing variation.

SUMMARY OF THE INVENTION

It is a general object of the present invention to provide a semiconductor device that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a semiconductor device particularly pointed out in the specification in such full, clear, concise, and exact terms as to enable a person having ordinary skill in the art to practice the invention.

To achieve these and other advantages in accordance with the purpose of the invention, the invention provides a semiconductor device, which includes a terminal configured to receive a first signal that is set from an exterior at a time of operation, a memory unit configured to retain a state of a setting fixedly regardless of whether at the time of operation or at a time of no operation and to produce at an output thereof a second signal responsive to the state of a setting, and an output driver unit coupled to the terminal and to the output of the memory unit to output an output signal by a drive power responsive to the first signal and the second signal.

According to at least one embodiment of the present invention, provision is made to make the signal drive power selectable according to instruction from the system after the implementation, thereby making the signal drive power adjustable in response to the load of a transmission line in the system. Further, fuses are set according to the results of a test conducted at the time of shipment from the factory or the like to select the signal drive power, so that a desired signal drive power can be attained without being affected by manufacturing variation. Accordingly, high-speed and reliable data transmission is achieved between chips without being affected by a manufacturing variation of the semiconductor device or by the configuration of the system.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 1:
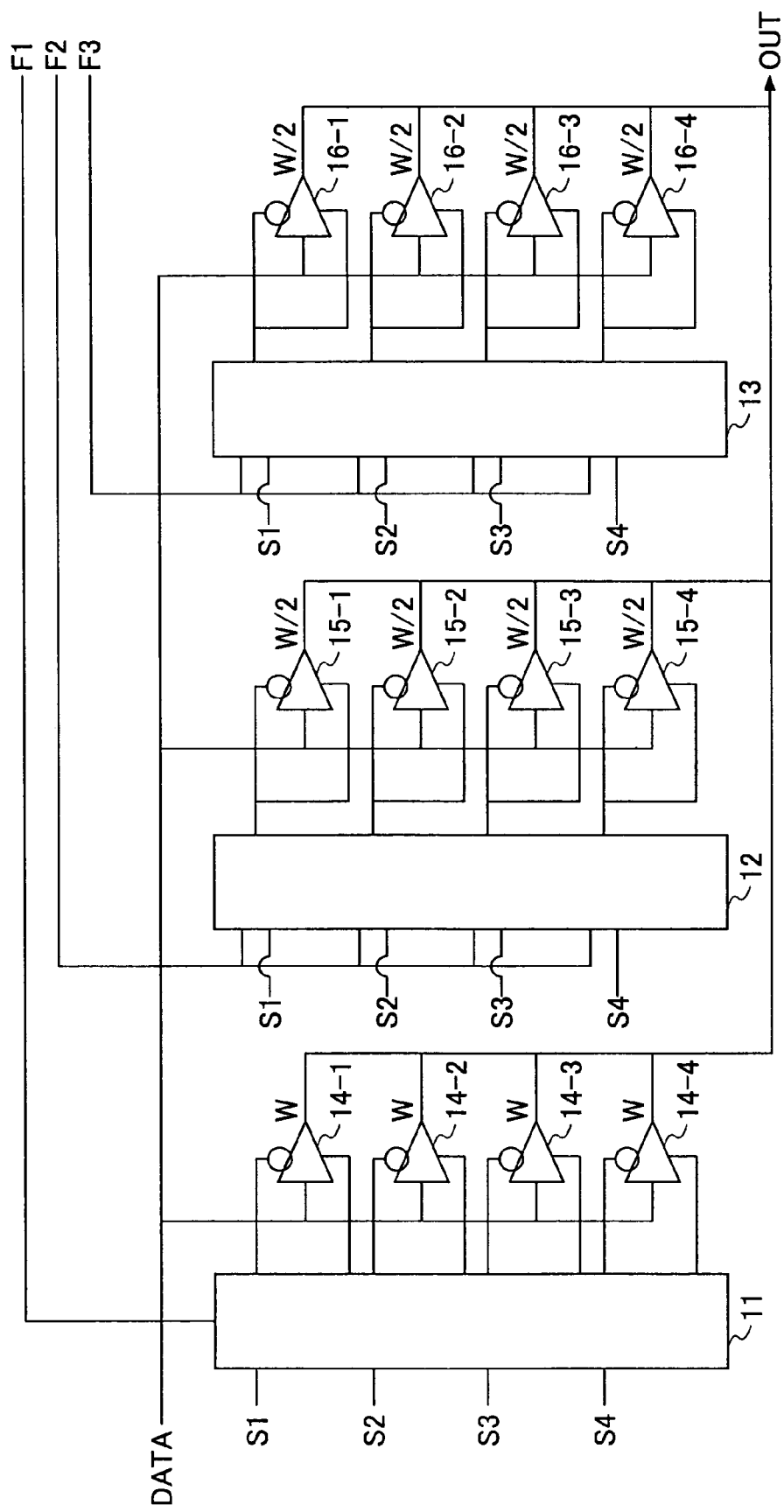
FIG. 1 is a drawing showing an example of the configuration of a driver unit provided with the function to adjust a signal drive power which is installed in a semiconductor device according to the present invention.

FIG. 1 is a drawing showing an example of the configuration of a driver unit provided with the function to adjust a signal drive power which is installed in a semiconductor device according to the present invention. A driver unit 10 shown in FIG. 1 includes driver selective-drive units 11 through 13, first drivers 14-1 through 14-4, second drivers 15-1 through 15-4, and third drivers 16-1 through 16-4. In an example shown in FIG. 1, there are three sets each including 4 drivers. The number of drivers and the number of sets are not limited to particular numbers, and a plurality of sets each having a plurality of sets serve the purpose.

In the example shown in FIG. 1, the first drivers 14-1 through 14-4 have twice as great a signal drive power as the second drivers 15-1 through 15-4 and the third drivers 16-1 through 16-4. This is achieved by implementing the first drivers 14-1 through 14-4 by use of the output transistors having a gate width W and implementing the second drivers 15-1 through 15-4 and the third drivers 16-1 through 16-4 by use of the output transistors having a gate width w/2, for example.

The driver selective-drive units 11 through 13 only drive the drivers selected by signals F1 through F3 and signals S1 through S4 from the first drivers 14-1 through 14-4, the second drivers 15-1 through 15-4, and the third drivers 16-1 through 16-4. Each of the selectively driven drivers outputs an output signal responsive to an input data signal DATA. Further, the output signals of the respective drivers are then combined together into an output signal OUT. Such selective driving of drivers makes it possible to drive the output signal OUT responsive to the data signal DATA by a desired signal drive power.

Specifically, the driver selective-drive unit 11 drives one or more of the first drivers 14-1 through 14-4 in response to the signals S1 through S4 when the signal F1 is asserted. By the same token, the driver selective-drive unit 12 drives one or more of the second drivers 15-1 through 15-4 in response to the signals S1 through S4 when the signal F2 is asserted. Further, the driver selective-drive unit 13 drives one or more of the third drivers 16-1 through 16-4 in response to the signals S1 through S4 when the signal F3 is asserted.

The driver selective-drive unit 11, for example, does not drive the first drivers 14-1 through 14-4 unless the signal F1 is asserted. When the signal F1 is asserted, one or more of the first drivers 14-1 through 14-4 corresponding to the asserted one or more of the signals S1 through S4 are driven. A logic to implement this operation is obtained by performing an AND operation between each of the signals S1 through S4 and the signal F1, thereby generating signals for driving the first drivers 14-1 through 14-4. The same also applies in the case of signals F2 and F3.

The signals F1 through F3 assume signal levels that are determined by cutting/leaving intact fuses at the time of shipment of the semiconductor device from the factory. The signals S1 through S4 assume signal levels that are determined according to the settings made by the system in which the semiconductor device is implemented.

Figures 2, 3:
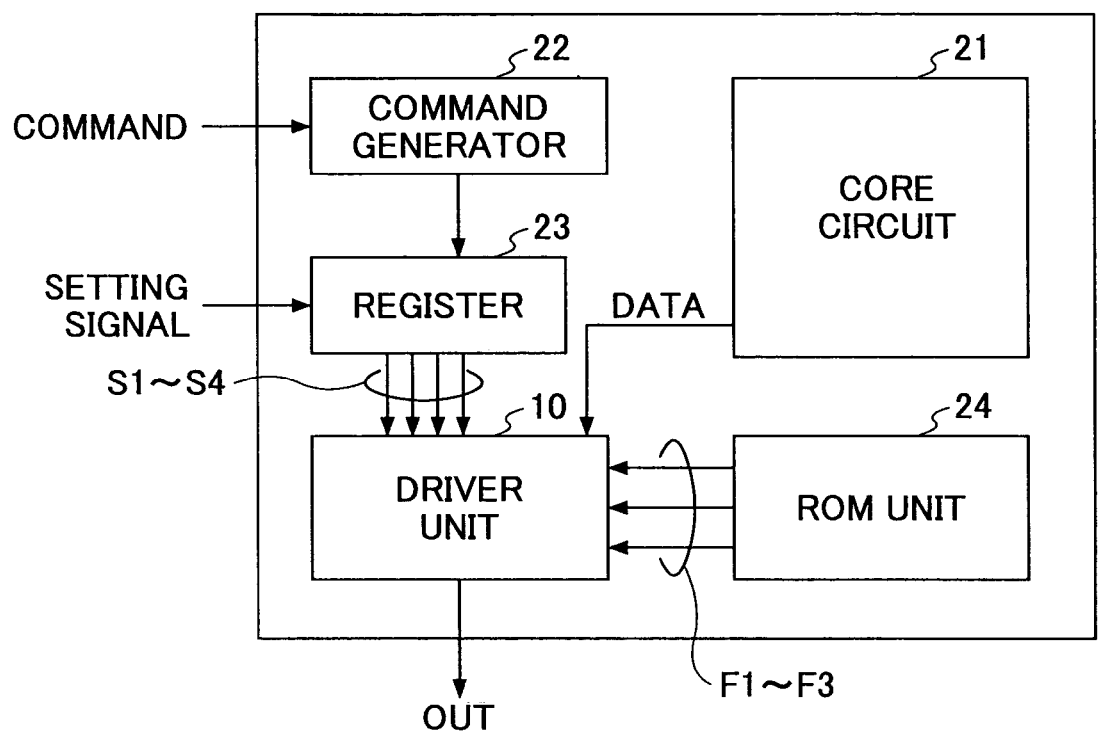
FIG. 2 is a drawing showing an example of the configuration of the semiconductor device according to the present invention.
FIG. 3 is a drawing showing the relationship between signals S1 through S4 and a signal drive power.

FIG. 2 is a drawing showing an example of the configuration of the semiconductor device according to the present invention. A semiconductor device 20 shown in FIG. 2 includes a driver unit 10, a core circuit 21, a command generator 22, a register 23, and a ROM unit 24. The core circuit 21 is a circuit portion that implements the main functions of the semiconductor device 20, and corresponds to a memory array, decoders, sense amplifiers, etc., in the case where the semiconductor device 20 is a semiconductor memory device. Data output from the core circuit 21 is supplied to the driver unit 10 shown in FIG. 1. Further, the driver unit 10 may receive the signals F1 through F3 from the ROM unit (fuse circuit) 24, and may receive the signals S1 through S4 from the register 23.

The ROM unit 24 includes fuses therein. The fuses are cut or left intact at the time of shipment of the semiconductor device 20 from the factory, thereby determining the signal levels of the signals F1 through F3. The register 23 receives a setting signal from an exterior of the semiconductor device 20, so that the signals S1 through S4 are set in the register 23 according to the setting signal. Specifically, a register setting command may be entered into the command generator 22 from the exterior, and, in response, the command generator 22 supplies a signal latch instruction to the register 23. In response to the signal latch instruction, the register 23 loads and latches the setting signal.

As described above, the signals S1 through S4 are set according to instruction or the like supplied from the system after the implementation in the system. In response to the signals S1 through S4, the signal drive power is adjusted between 25% and 100%, for example.

FIG. 3 is a drawing showing the relationship between the signals S1 through S4 and the signal drive power. As shown in FIG. 3, if the signals S1, S2, S3, and S4 are HIGH, LOW, LOW, and LOW, respectively, a signal driver power of 25% is obtained. In the case of the driver selective-drive unit 11, for example, this is achieved by driving the first driver 14-1 in response to the assertion (HIGH) of the signal S1. If the signals S1, S2, S3, and S4 are HIGH, HIGH, LOW, and LOW, respectively, a signal driver power of 50% is obtained. In the case of the driver selective-drive unit 11, for example, this is achieved by driving the first drivers 14-1 and 14-2 in response to the assertion (HIGH) of the signals S1 and S2. By the same token, drivers are selectively driven to achieve a desired signal drive power in the case of signal driver powers of 75% and 100%

In the following, a description will be given of a method of determining signal levels of the signals F1 through F3 controlled by cutting/leaving intact fuses at the time of shipment of the semiconductor device from the factory.

After the manufacturing process of the semiconductor device, a test or the like is conducted to measure the signal drive power of the driver unit 10 at the time of shipment from the factory or the like. Upon the completion of the manufacturing process, for example, the first drivers 14-1 through 14-4 and the second drivers 15-1 through 15-4 are driven for the measurement of the signal drive powers. If the measured signal drive powers are substantially the same as predetermined signal drive powers, the fuses of the ROM unit 24 are cut/left intact in such a manner as to set the signals F1 and F2 in an asserted state and the signal F3 in a negated state. If the measured signal drive powers are far lower than the predetermined signal drive powers, the fuses of the ROM unit 24 are cut/left intact in such a manner as to set all the signals F1 through F3 in an asserted state. If the measured signal drive powers are far higher than the predetermined signal drive powers, the fuses of the ROM unit 24 are cut/left intact in such a manner as to set the signal F1 in an asserted state and the signals F2 and F3 in a negated state.

Namely, if the signal drive powers are neither too high nor too low, the fuses are set such as to drive only the first drivers 14-1 through 14-4 and the second drivers 15-1 through 15-4, for example. If the signal drive powers are too low, the fuses are set such as to drive the first drivers 14-1 through 14-4, the second drivers 15-1 through 15-4, and the third drivers 16-1 through 16-4, for example. If the signal drive powers are too high because of process variation, the fuses are set such as to drive only the first drivers 14-1 through 14-4. If it is desired to lower the signal drive powers further, then, provision may be made to drive only the second drivers 15-1 through 15-4. In this manner, the signal drive power may be adjusted by adjusting the gate width of drive transistors.

In the semiconductor device of the present invention as described above, provision is made to make the signal drive power selectable according to instruction from the system after the implementation, thereby making the signal drive power adjustable in response to the load of the transmission lines of the system. Further, fuses are set according to the results of a test conducted at the time of shipment from the factory or the like to select the signal drive power, so that a desired signal drive power can be attained without being affected by manufacturing variation. Accordingly, high-speed and reliable data transmission is achieved between chips without being affected by a manufacturing variation of the semiconductor device or by the configuration of the system.

Figure 4:
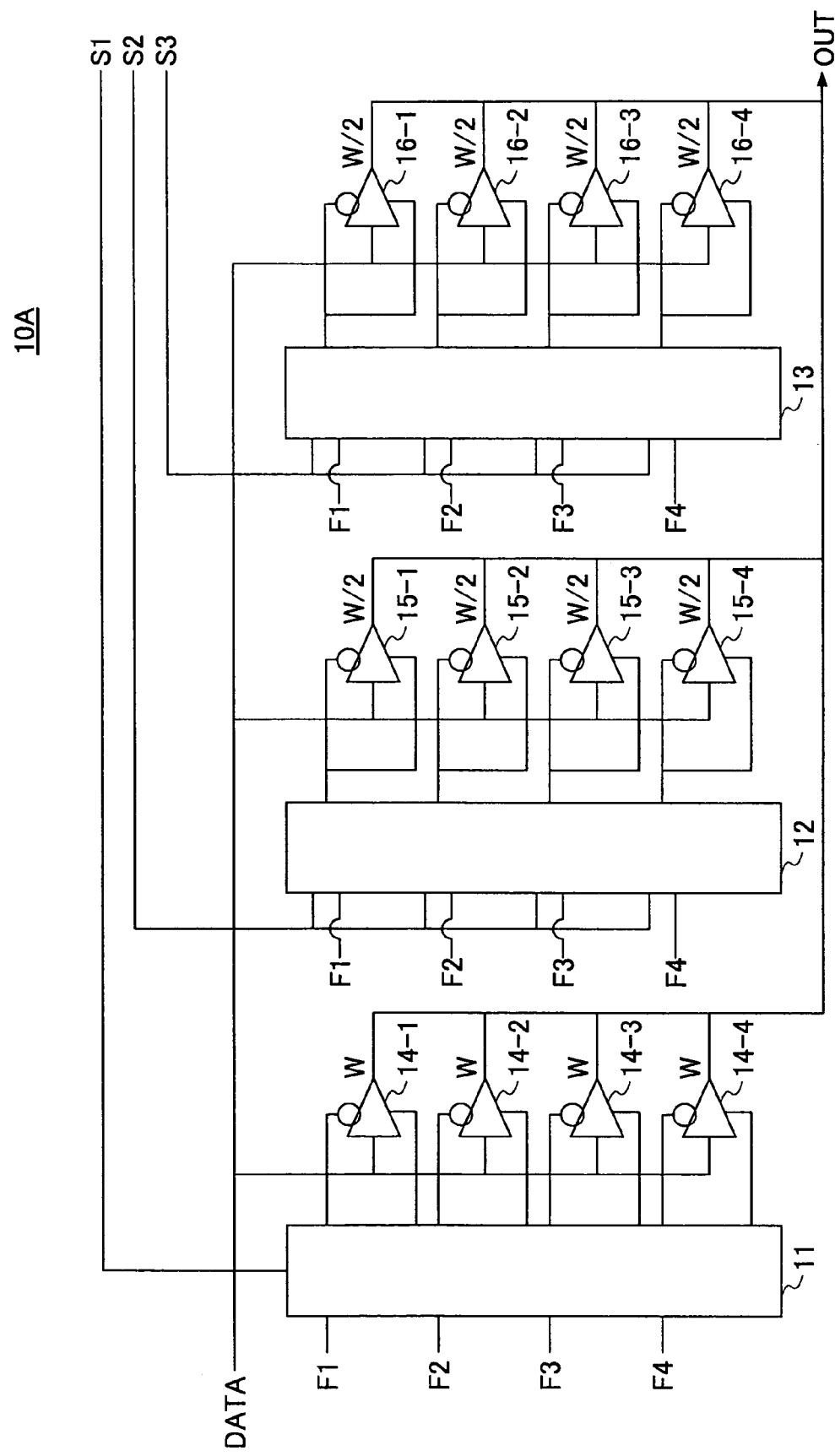
FIG. 4 is a drawing showing another example of the configuration of the driver unit provided with the function to adjust a signal drive power which is installed in the semiconductor device according to the present invention.

FIG. 4 is a drawing showing another example of the configuration of the driver unit provided with the function to adjust a signal drive power which is installed in the semiconductor device according to the present invention. In FIG. 4, the same elements as those of FIG. 1 are referred to by the same numerals, and a description thereof will be omitted.

The circuit configuration shown in FIG. 4 is the same as the circuit configuration shown in FIG. 1. In the configuration shown in FIG. 4, however, the position of the signals from the register 23 is exchanged with the position of the signals from the ROM unit 24 in contrast with the configuration of FIG. 1. That is, the circuit portions where the signals S1 through S4 from the register 23 are input in FIG. 1 receive the signals F1 through F4 from the ROM unit 24 in FIG. 4. Further, the circuit portions where the signals F1 through F3 from the ROM unit 24 are input in FIG. 1 receive the signals S1 through S3 from the register 23 in FIG. 4.

The signals F1 through F4 assume signal levels that are determined by cutting/leaving intact fuses at the time of shipment of the semiconductor device from the factory. The signals S1 through S3 assume signal levels that are determined according to the settings made by the system in which the semiconductor device is implemented.

In this manner, provision may be made such that fuse settings determine the number of drivers driven among the four drivers in one set (e.g., among the four first drivers 14-1 through 14-4) and that system instruction determines one or more sets driven among the three sets. Namely, it suffices if the signal drive power is settable in response to both the signals controlled by the fuse settings and the signals controlled by the system settings. A specific configuration of the buffer selection mechanism is not a limiting factor.

Figure 5:
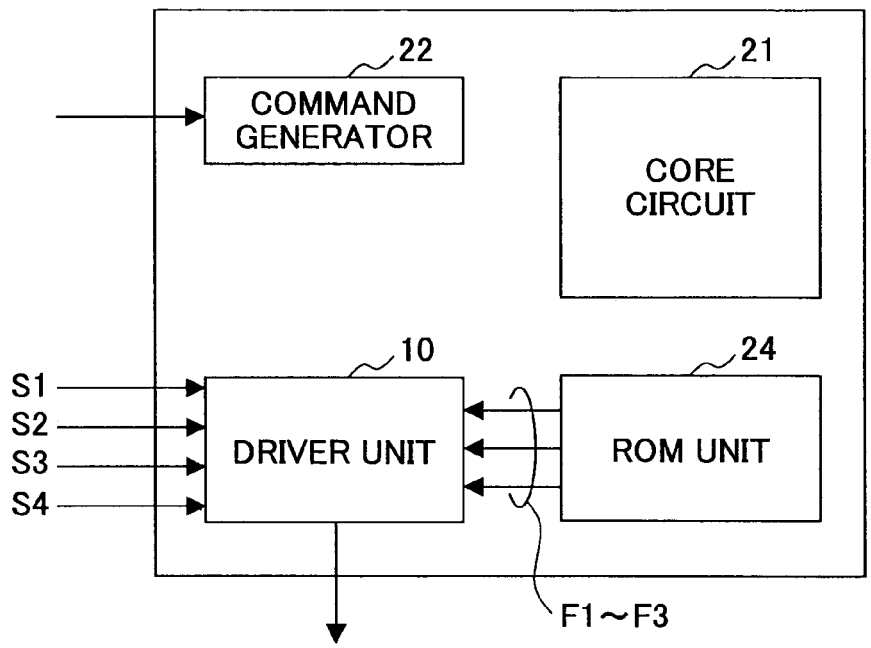
FIG. 5 is a drawing showing another example of the configuration of the semiconductor device according to the present invention.

FIG. 5 is a drawing showing another example of the configuration of the semiconductor device according to the present invention. In FIG. 5, the same elements as those of FIG. 2 are referred to by the same numerals, and a description thereof will be omitted.

A semiconductor device 20A shown in FIG. 5 includes the driver unit 10, the core circuit 21, the command generator 22, and the ROM unit 24. In contrast with the semiconductor device 20 shown in FIG. 2, the register 23 is removed in the semiconductor device 20A shown in FIG. 5. The driver unit 10 does not receive the signals S1 through S4 from the register 23, but receives the signals S1 through S4 directly from an exterior of the semiconductor device 20A. It should be noted that it is also possible to receive the signals S1 through S4 via the register 23. The ROM unit (fuse circuit) 24 provides the signals F1 through F3 in the same manner as in the configuration of FIG. 2.

Figure 6:
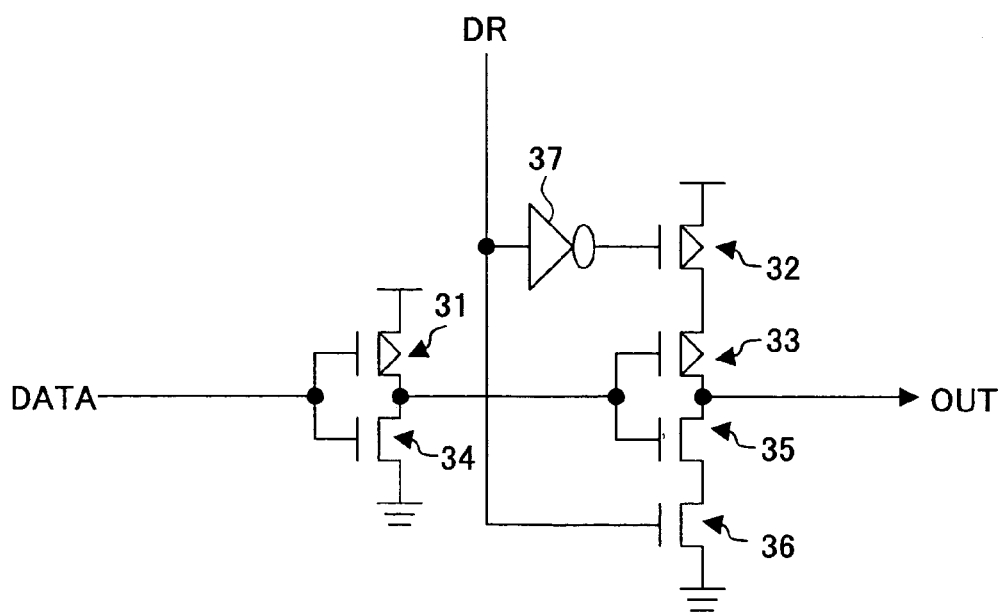
FIG. 6 is a drawing showing an example of the circuit configuration of a driver.

FIG. 6 is a drawing showing an example of the circuit configuration of a driver. The driver shown in FIG. 6 is used as the first drivers 14-1 through 14-4, the second drivers 15-1 through 15-4, and the third drivers 16-1 through 16-4.

The driver shown in FIG. 6 includes PMOS transistors 31 through 33, NMOS transistors 34 through 36, and an inverter 37. The circuits shown in FIG. 1 and FIG. 4 are configured such that the output signal OUT having the same logic as the data signal DATA is output. The driver illustrated in FIG. 6 thus includes two stages of inverters, i.e., an inverter comprised of the PMOS transistor 31 and the NMOS transistor 34 and another inverter comprised of the PMOS transistor 33 and NMOS transistor 35. If the driver configuration that outputs an inverse of the data signal DATA is acceptable, the inverter portion comprised of the PMOS transistor 31 and the NMOS transistor 34 is not necessary.

When a drive signal DR is HIGH, the PMOS transistor 32 and the NMOS transistor 36 are conductive. As a result, the power is supplied to the inverter comprised of the PMOS transistor 33 and the NMOS transistor 35, thereby driving the driver. When the drive signal DR is LOW, the PMOS transistor 32 and the NMOS transistor 36 are nonconductive, so that the driver is not driven.

The drive signal DR is a signal supplied from the driver selective-drive units 11 through 13 shown in FIG. 1 or FIG. 4. In the case of the driver selective-drive unit 11, for example, an AND operation is performed between each of the signals S1 through S4 and the signal F1 as previously described, thereby generating the drive signals DR for driving the first drivers 14-1 through 14-4. The same applies in the case of the driver selective-drive units 12 and 13.

Figure 7:
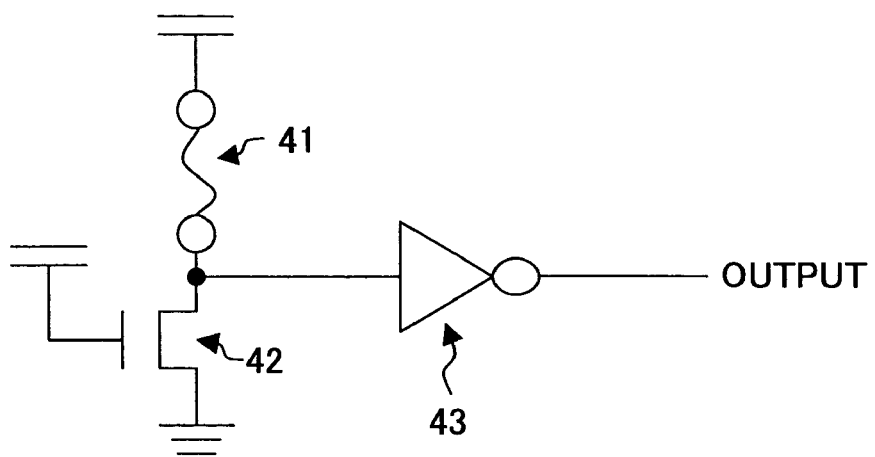
FIG. 7 is a drawing showing an example of a fuse circuit included in a ROM unit.

FIG. 7 is a drawing showing an example of a fuse circuit included in the ROM unit 24. The fuse circuit shown in FIG. 7 includes a fuse 41, an NMOS transistor 42, and an inverter 43. The NMOS transistor 42 is configured to be conductive with a high resistance between its source and drain. When the fuse 41 is intact, an input into the inverter 43 is HIGH, so that the output of the fuse circuit is LOW. When the fuse 41 is cut, the input into the inverter 43 is LOW, so that the output of the fuse circuit is HIGH. In this manner, provision is made to supply the signal responsive to the cut/intact state of the fuse.

In the configuration shown in FIG. 7, an electric current always flows through the fuse when the fuse is intact. As the number of fuses increases, thus, the current consumption also increases.

Figure 8:
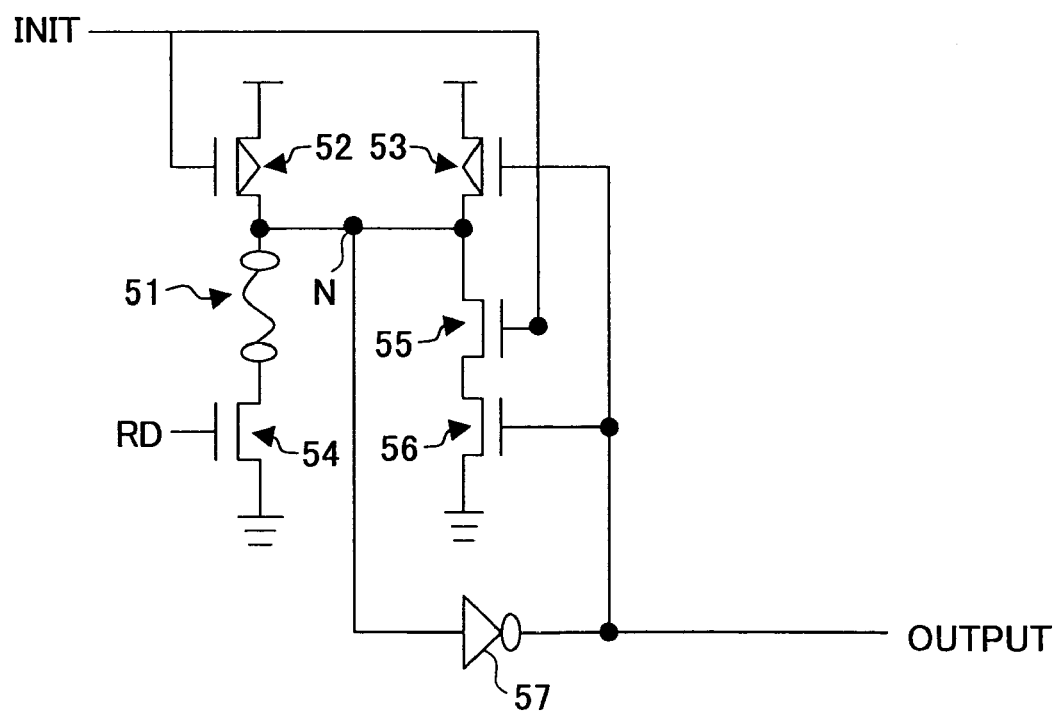
FIG. 8 is a drawing showing another example of the fuse circuit included in the ROM unit.

FIG. 8 is a drawing showing another example of the fuse circuit included in the ROM unit 24. The fuse circuit of FIG. 8 includes a fuse 51, PMOS transistors 52 and 53, NMOS transistors 54 through 56, and an inverter 57.

In a state immediately following a power-on (or immediately following a reset), an initial setting signal INIT is LOW, so that the PMOS transistor 52 is conductive, and the NMOS transistor 55 is nonconductive. Further, a fuse-state read signal RD is set to LOW, so that the NMOS transistor 54 is nonconductive. Accordingly, the potential at a node N is HIGH regardless of the state of the fuse 51. The output of the inverter 57 is thus LOW.

After the passage of a predetermined time period following the power-on (or reset), the initial setting signal INIT becomes HIGH. In response, the PMOS transistor 52 becomes nonconductive, and the NMOS transistor 55 becomes conductive. Accordingly, a latch comprised of the inverter 57 and an inverter including the PMOS transistor 53 and the NMOS transistor 56 latches and holds the state in which the potential at the node N is HIGH.

As the fuse-state read signal RD becomes HIGH thereafter, the potential at the node N differs depending on the condition of the fuse 51. If the fuse 51 is cut, the potential at the node N stays at HIGH, so that the output of the fuse circuit is set to LOW (remains LOW). If the fuse 51 is intact, the potential at the node N becomes LOW, so that the output of the fuse circuit is set to HIGH. In this manner, provision is made to supply the signal responsive to the cut/intact state of the fuse. In the configuration shown in FIG. 8, no electric current runs through the fuse at the time of circuit operation, thereby reducing the current consumption.

Figure 9:
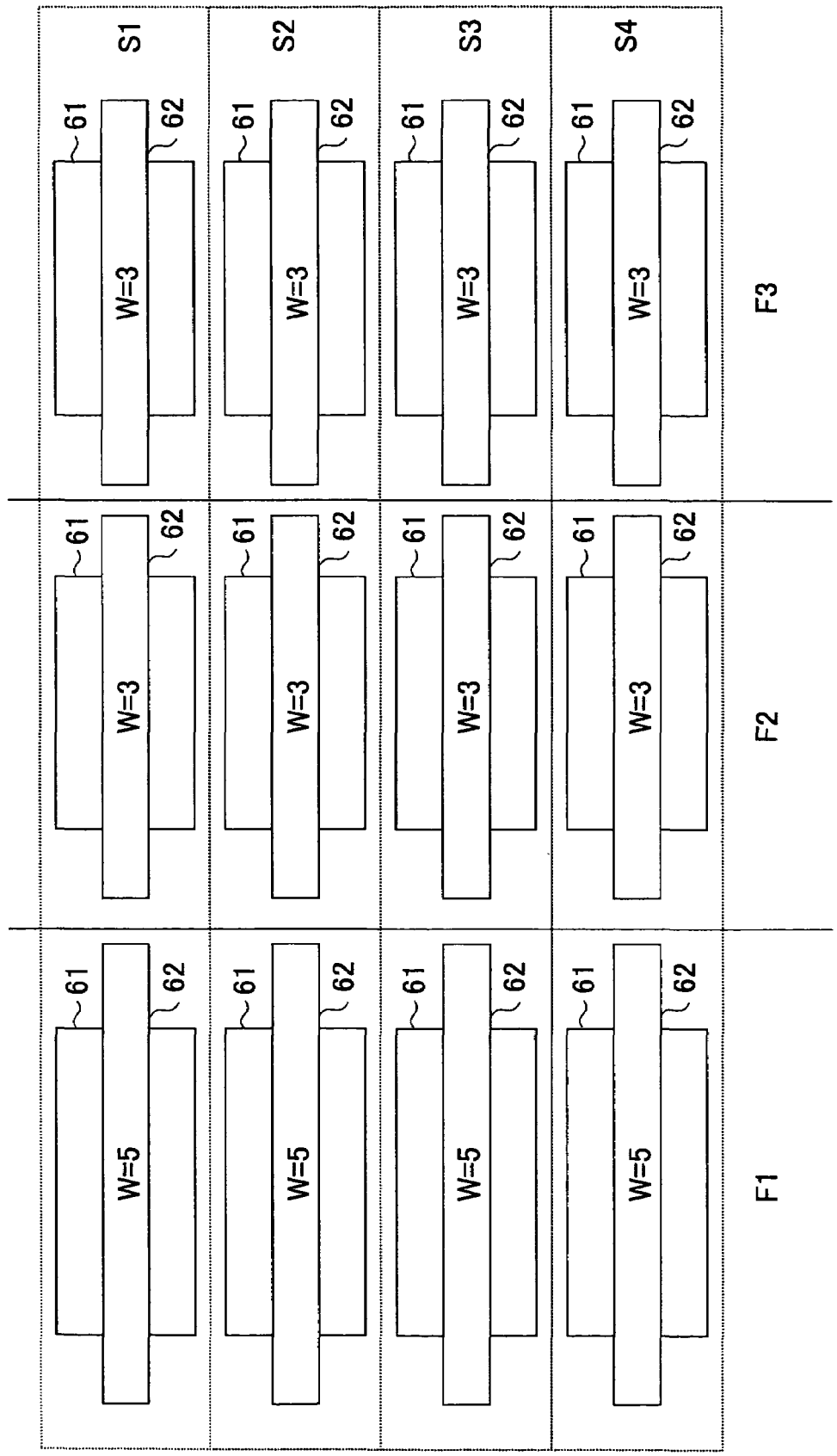
FIG. 9 is a drawing showing an example of the layout of a driver of the driver unit.

FIG. 9 is a drawing showing an example of the layout of a driver of the driver unit. In FIG. 9, a transistor constituting part of a driver is comprised of a diffusion region 61 forming the source and drain and a gate 62. In the example shown in FIG. 9, transistors are arranged in three vertical columns and four horizontal rows.

The transistors in the left-hand-side column, the transistors in the center column, and the transistors in the right-hand-side column have respective gate widths W whose ratio is 5:3:3. These transistor columns are assigned to the signals F1 through F3 provided for the purpose of correcting manufacturing variation based on fuse settings. Further, the transistors in the first through fourth rows from top to bottom in FIG. 9 are assigned to the signals S1 through S4 provided for the purpose of matching with the load of the transmission line based on the system settings.

In the configuration shown in FIG. 9, the transistors having different gate widths are selected to adjust the signal drive power with respect to the correction of manufacturing variation based on the fuse settings, and the number of gates (the number of transistors) is selected to adjust the signal drive power with respect to the matching of the load of the transmission line based on the system settings.

Figure 10:
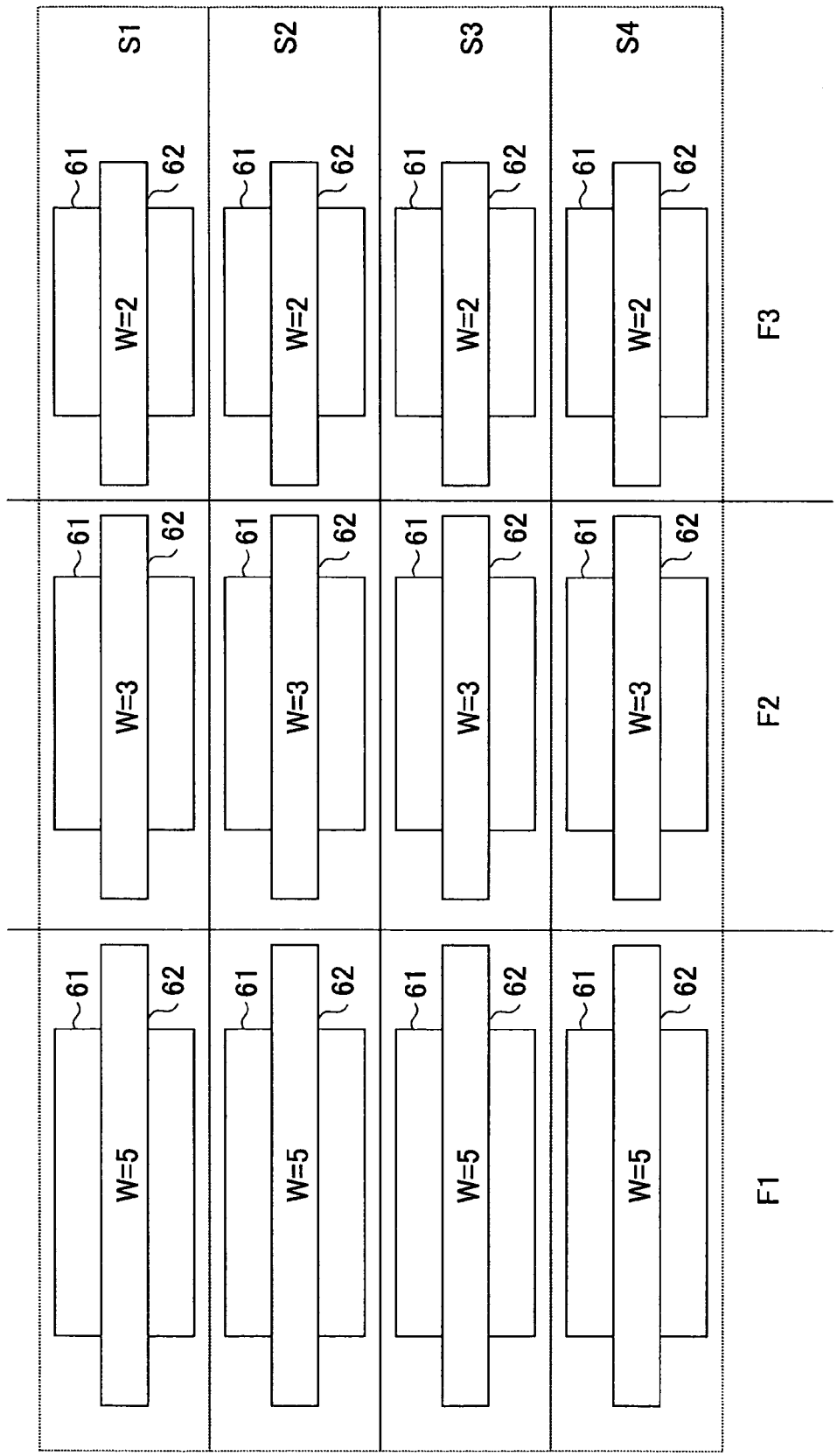
FIG. 10 is a drawing showing another example of the layout of a driver of the driver unit.

FIG. 10 is a drawing showing another example of the layout of a driver of the driver unit. In FIG. 10, a transistor constituting part of a driver is comprised of the diffusion region 61 forming the source and drain and the gate 62. In the example shown in FIG. 10, transistors are arranged in three vertical columns and four horizontal rows.

The transistors in the left-hand-side column, the transistors in the center column, and the transistors in the right-hand-side column have respective gate widths W whose ratio is 5:3:2. These transistor columns are assigned to the signals F1 through F3 provided for the purpose of correcting manufacturing variation based on fuse settings. Further, the transistors in the first through fourth rows from top to bottom in FIG. 9 are assigned to the signals S1 through S4 provided for the purpose of matching with the load of the transmission line based on the system settings.

In the configuration shown in FIG. 10, the gate width of the transistors is different for each column, which provides for finer adjustment to be made to the signal drive power in terms of the correction of manufacturing variation. That is, the drivers having gate widths W whose ratio is 5:3:2 can be combined to produce a relative signal drive power of 2, 3, 5, 7 (=5+2), 8 (=5+3), and 10(=5+3+2).

Figure 11:
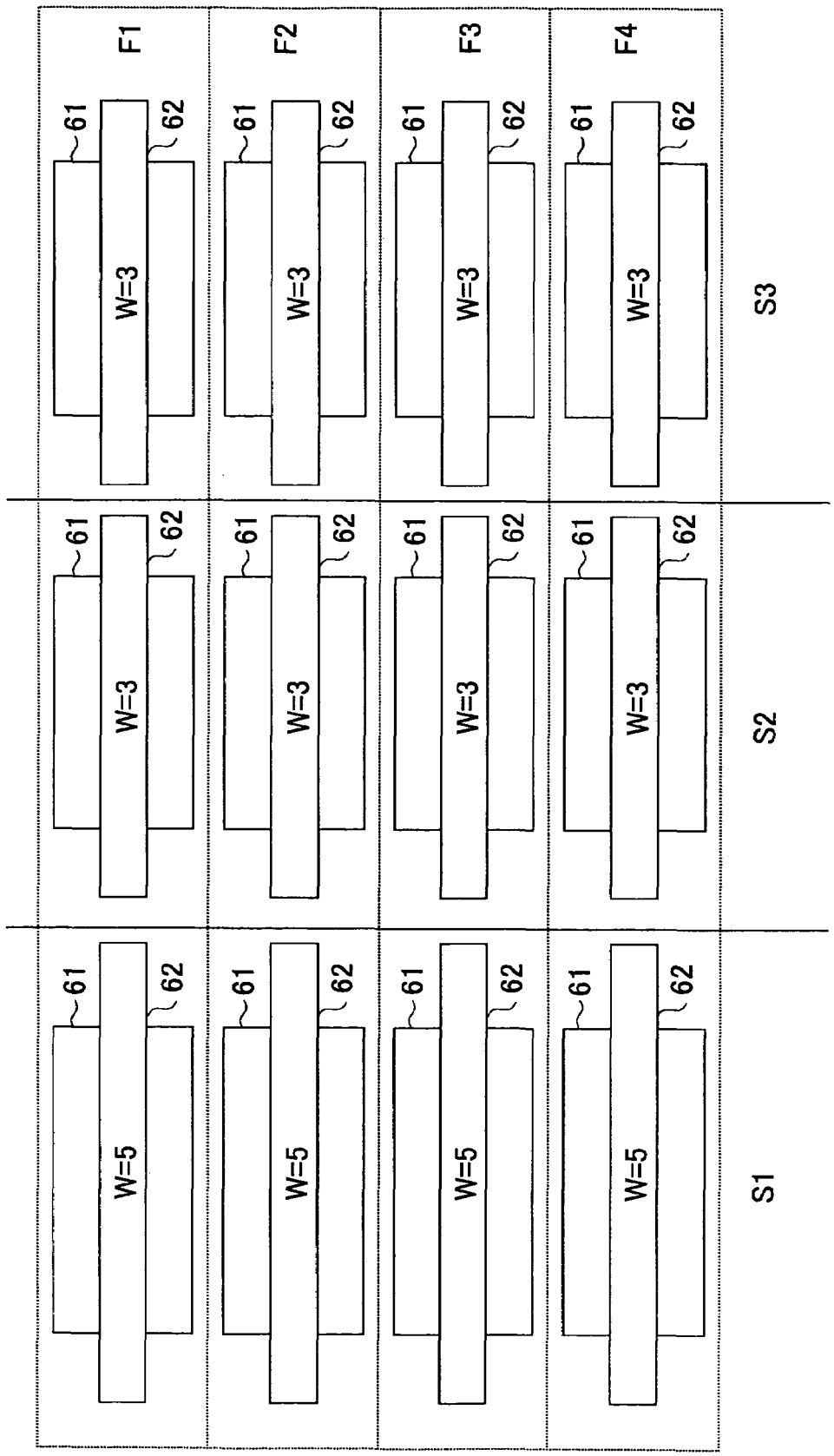
FIG. 11 is a drawing showing yet another example of the layout of a driver of the driver unit.

FIG. 11 is a drawing showing yet another example of the layout of a driver of the driver unit. The configuration shown in FIG. 11 is basically the same as the configuration shown in FIG. 9. However, the transistors in the left-hand-side column, the transistors in the center column, and the transistors in the right-hand-side column are assigned to the signals S1 through S3, respectively, for the purpose of matching with the load of the transmission line based on the system settings. Further, the transistors in the first through fourth rows from top to bottom in FIG. 11 are assigned to the signals F1 through F4 provided for the purpose of correcting manufacturing variation based on the fuse settings. That is, the layout shown in FIG. 11 corresponds to the configuration shown in FIG. 4 whereas the layout shown in FIG. 9 corresponds to the configuration shown in FIG. 1.

In the configuration shown in FIG. 11 as described above, the number of gates (the number of transistors) is selected to adjust the signal drive power with respect to the correction of manufacturing variation based on the fuse settings, and the transistors having different gate widths are selected to adjust the signal drive power with respect to the matching of the load of the transmission line based on the system settings.

Figure 12:
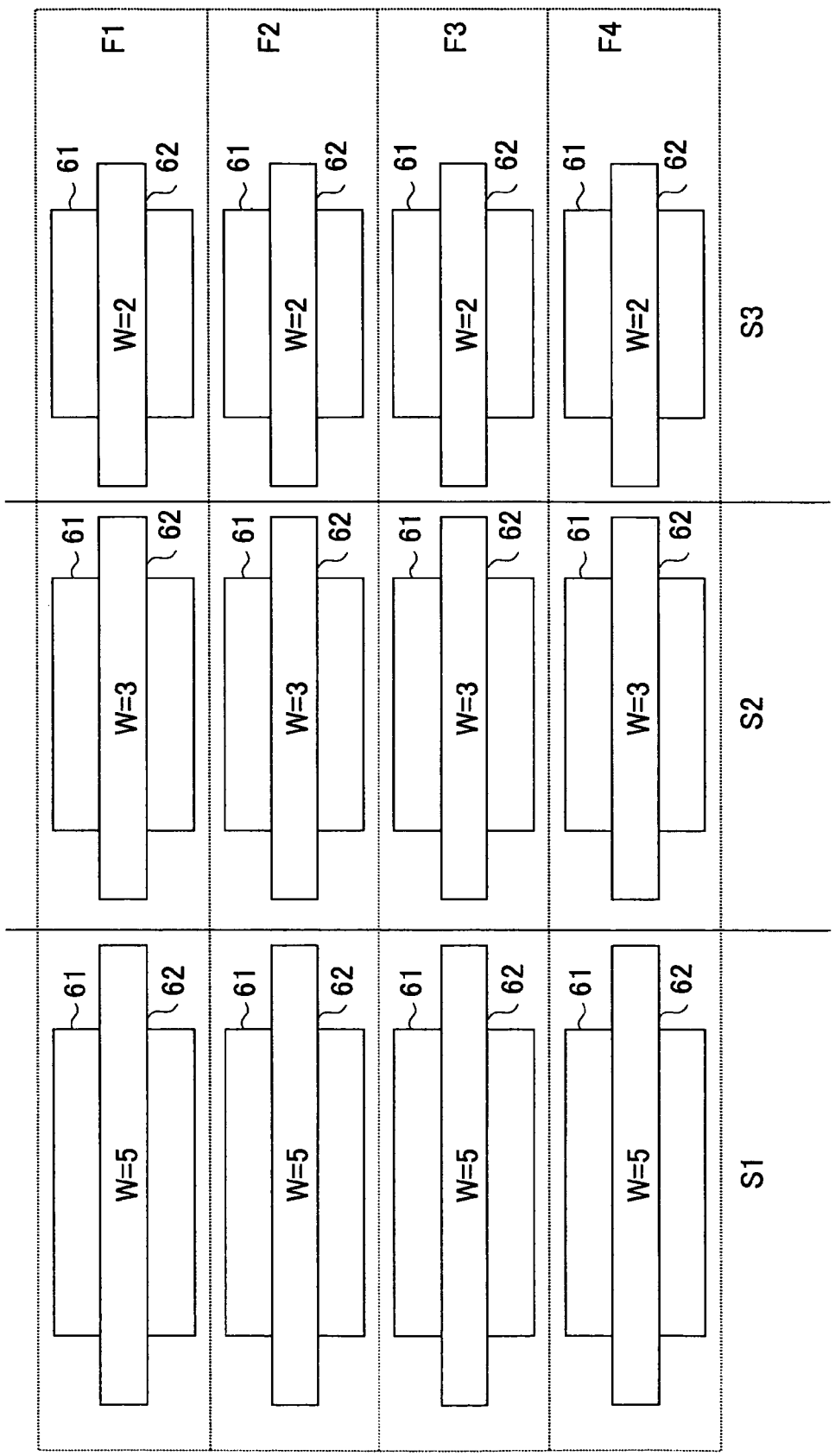
FIG. 12 is a drawing showing still another example of the layout of a driver of the driver unit.

FIG. 12 is a drawing showing still another example of the layout of a driver of the driver unit. In FIG. 12, the arrangement of the transistors and the assignment of the signals for adjusting the signal drive power are the same as in FIG. 11. It should be noted, however, that the transistors in the left-hand-side column, the transistors in the center column, and the transistors in the right-hand-side column have respective gate widths W whose ratio is 5:3:2.

In the configuration shown in FIG. 12, the gate width of the transistors is different for each column, which provides for finer adjustment to be made to the signal drive power in terms of matching with the load of the transmission line based on system settings. That is, the drivers having gate widths W whose ratio is 5:3:2 can be combined to produce a relative signal drive power of 2, 3, 5, 7 (=5+2), 8 (=5+3), and 10(=5+3+2).

Further, the present invention is not limited to these embodiments, but various variations and modifications may be made without departing from the scope of the present invention.

In the description provided above, the ROM unit 24 was described as being programmed through the cutting or leaving intact of fuses. Rather than using fuses, a memory device that is programmable in a nonvolatile manner may be used. For the purpose of the present invention, the ROM unit 24 may suitably be a device that is fixedly settable as to signal states at the time of shipment from the factory or the like.

What is claimed is:

1. A semiconductor device, comprising:
   a core circuit configured to produce a data signal;
   a node configured to receive a first signal that is set from an exterior at a time of operation;
   a memory unit configured to retain a state of a setting fixedly regardless of whether at the time of operation or at a time of no operation and to produce at an output thereof a second signal responsive to the state of a setting; and
   an output driver unit coupled to said core circuit, to said node and to the output of said memory unit to output an output signal responsive to the data signal by a drive power responsive to the first signal and the second signal, the first signal and the second signal being different from the data signal, wherein the drive power is a product of a power determined by the second signal and a selected one of at least two non-zero percentages selectable by the first signal.

2. The semiconductor device as claimed in claim 1, wherein said terminal is configured to receive the first signal supplied from the exterior of the semiconductor device.

3. The semiconductor device as claimed in claim 1, further comprising a register unit operable to be set from the exterior at the time of operation, said node configured to receive the first signal from said register unit.

4. The semiconductor device as claimed in claim 1, wherein said memory unit is a ROM circuit that retains the state of a setting through cutting or leaving intact of a fuse.

5. The semiconductor device as claimed in claim 1, wherein said output driver unit includes a plurality of output transistors for outputting the output signal, said output transistors being driven in a number responsive to the first signal and the second signal.

6. The semiconductor device as claimed in claim 5, wherein said plurality of output transistors includes output transistors having different gate widths, the output transistors having an identical gate width being driven in a number corresponding to the first signal, and the output transistors having different gate widths being driven in response to the second signal.

7. The semiconductor device as claimed in claim 5, wherein said plurality of output transistors includes output transistors having different gate widths, the output transistors having an identical gate width being driven in a number corresponding to the second signal, and the output transistors having different gate widths being driven in response to the first signal.

8. The semiconductor device as claimed in claim 1, wherein the first signal is to be set in response to a load of a transmission line connected to said semiconductor device.

9. The semiconductor device as claimed in claim 1, wherein the state of a setting retained by said memory unit is set in response to a result of a test testing a signal drive power of said output driver unit.

* * * * *